(12) United States Patent
Vermeire et al.

(10) Patent No.: US 7,271,608 B1
(45) Date of Patent: Sep. 18, 2007

(54) PROGNOSTIC CELL FOR PREDICTING FAILURE OF INTEGRATED CIRCUITS

(75) Inventors: Bert M. Vermeire, Tucson, AZ (US);
Harold G. Parks, Tombstone, AZ (US);
Douglas L. Goodman, Tucson, AZ (US)

(73) Assignee: Ridgetop Group, Inc., Tucson, AZ (US)

( * ) Notice: Subject to any disclaimer, the term of this patent is extended or adjusted under 35 U.S.C. 154(b) by 694 days.

(21) Appl. No.: 10/716,686

(22) Filed: Nov. 19, 2003

Related U.S. Application Data

(60) Provisional application No. 60/428,655, filed on Nov. 25, 2002.

(51) Int. Cl.
*G01R 31/02* (2006.01)

(52) U.S. Cl. .................. 324/763; 324/158.1; 340/653; 702/34

(58) Field of Classification Search ................ 324/760, 324/763, 765, 158.1; 340/635, 653; 702/34
See application file for complete search history.

(56) References Cited

U.S. PATENT DOCUMENTS

| | | | | |
|---|---|---|---|---|
| 4,833,395 A | * | 5/1989 | Sasaki et al. ............. | 324/763 |
| 5,117,113 A | * | 5/1992 | Thomson et al. ........ | 250/370.07 |
| 5,822,218 A | * | 10/1998 | Moosa et al. .................. | 716/4 |
| 6,005,407 A | * | 12/1999 | Arabi et al. ................ | 324/765 |
| 6,348,806 B1 | * | 2/2002 | Okandan et al. ............ | 324/763 |
| 6,724,214 B2 | * | 4/2004 | Manna et al. ............... | 324/766 |
| 6,873,171 B2 | * | 3/2005 | Reynick ..................... | 324/765 |
| 7,005,871 B1 | * | 2/2006 | Davies et al. ............... | 324/763 |

OTHER PUBLICATIONS

V. C. Tyree, "Self stressing rest structure cells", Rome Laboratory, Air Force Materiel Command, Feb. 1995, New York.
T. P. Ma et al., "Ionizing Radiation Effects in MOS Devices and Circuits", John Wiley and Sons, 1989.
G. Anelli et al., "Radiation tolerant VLSI circuits in standard deep submicron CMOS technologies for the LHC experiments: Practical design aspects," IEEE Trans. Nucl. Sci., vol. 46, pp. 1690-1696, 1999.
G. S. Share, "Effects of Ionizing Radiation on Thin Oxide (20- 1500 Å) MOS Capacitors," J. Appl. Phys., vol. 45, pp. 4894, 1974.
R. C. Lacoe et al., "Total-dose radiation tolerance of a commercial 0.35 mm CMOS process," presented at Radiation Effects Data Workshop, 1998.

(Continued)

*Primary Examiner*—Ernest Karlsen
*Assistant Examiner*—Arleen M. Vazquez
(74) *Attorney, Agent, or Firm*—Eric A. Gifford

(57) ABSTRACT

A prognostic cell is used to predict impending failure of a useful circuit or circuits in a host IC. Increasing the stress on the prognostic cell relative to the useful circuit shifts the failure distribution of the cell along the time axis. The relative amount of time between the useful circuit failure and prognostic cell trigger point is the "prognostic distance". The prognostic distance is controlled by designing in the excess stress applied in test device(s), by setting the threshold for triggering in the comparison circuit or by both. Prediction accuracy is enhanced by using multiple test devices to oversample the underlying failure distribution and triggering the failure indicator when a certain fraction fail.

55 Claims, 12 Drawing Sheets

OTHER PUBLICATIONS

R. C. Lacoe et al., "Total-dose tolerance of a Chartered Semiconductor 0.35 mm CMOS process," presented at Radiation Effects Data Workshop, 1999.

R. C. Lacoe et al., "Application of Hardness-By-Design Methodology to Radiation-Tolerant ASIC Technologies," IEEE Trans. Nucl. Sci., vol. 47, pp. 2334-2341, 2000.

R. C. Lacoe et al., "Total-dose tolerance of the commercial Taiwan Semiconductor Manufacturing Company (TSMC) 0.35 mm CMOS process," presented at Radiation Effects Data Workshop, 2001.

J. W. R. Dawes et al., "Process technology for radiation-hardened CMOS integrated circuits," IEEE J. Solid State Circuits, vol. SC-11, pp. 459, 1976.

J.M. Benedetto et al., "Mosfet and MOS Capacitor Responses to Ionizing Radiation" IEEE Transactions on Nuclear Science, vol. NS-31, No. 6, Dec. 1984.

A. Mekkaoui et al., "30Mrad(SiO2) radiation tolerant pixel front end for the BTEV experiment," Nucl. Instr. and Meth. A, vol. 465, pp. 166-175, 2001.

J. D. M. Fleetwood, "A Reevaluation of Worst-Case Post-irradiation Response for Hardened MOS Transistors," IEEE Trans. Nucl. Sci., vol. NS-34, p. 1178, 1987.

K. P. V. Dressendorfer, "The Effects of Test Conditions on MOS Radiation Hardness Results," IEEE Trans. Nucl. Sci., vol. NS-28, p. 4281, 1981.

M. Kimura, "Field and Temperature acceleration model for time-dependent dielectric breakdown," IEEE Trans. Electron Devices, vol. 46, pp. 220-229, 1999.

\* cited by examiner

US 7,271,608 B1

PROGNOSTIC CELL FOR PREDICTING FAILURE OF INTEGRATED CIRCUITS

CROSS-REFERENCE TO RELATED APPLICATIONS

This application claims benefit of priority under 35 U.S.C. 119(e) to U.S. Provisional Application No. 60/428,655 entitled "Method for making semiconductor reliability indicator cells" filed on Nov. 25, 2002, the entire contents of which are incorporated by reference.

BACKGROUND OF THE INVENTION

1. Field of the Invention

This invention relates to integrated circuits (ICs) and more specifically to a prognostic cell capable of predicting impending failure of a useful circuit on the IC.

2. Description of the Related Art

All manufactured products have non-zero failure probability, that is, there is at every instance of use a certain probability that the product will fail. A particular product line's failure rate is the number of such products that is expected to fail per unit time. The failure rate is thus equivalent with the failure probability.

The failure probability during the life of a manufactured product typically follows a bathtub curve 10 as shown in FIG. 1. The bathtub curve contains three distinct regions: (i) an initial region 12 where the failure probability is high, called the burn-in or infant mortality region, (ii) a useful life region 14 where the failure rate is at its minimum, and (iii) an end-of-life region 16 where the product's failure rate starts to increase due to component wear. The bathtub curve can be measured for a particular product line when that product is used under well-defined conditions. This allows a manufacturer to specify (guarantee) a product's lifetime. A product's useful lifetime is typically defined as ending when the failure rate (or equivalently, failure probability) starts to increase due to wear. Wear is a function of time, intensity of use and environment. For microelectronic devices, the environment includes variables such as temperature, operating voltage, operating current, incident radiation, humidity, presence of corrosives etc.

The actual lifetime of a product used in the field may be very different than the lifetime measured under controlled and specified conditions. Part of that difference is due to variability of individual instances of a product (individual parts) within a particular product line. However, a large determining factor for actual part lifetime is determined by the place and method in which that part is used. This means that the bathtub curve for a particular part (which is the probability that that particular instance of a product will fail as a function of time) can be shifted substantially relative to the baseline.

For electronics applications where system reliability is important, system designers often assume worst-case conditions for reliability calculations. Integrated circuits can then be selected that meet the worst-case requirements. However, worst-case conditions are typically poorly defined and are usually not continuously present. Therefore, a worst-case design approach often results in over-specification of reliability requirements. Sometimes no integrated circuits are available that meet the system reliability requirements. In that case the system designer must build in redundancy to meet the reliability goal.

Latent weakness in the product due to non-idealities of the manufacturing process or due to mishandling of the product prior to or during use can also result in early failure. In effect, latent weakness has shifted the part along the time axis of the bathtub curve.

It would be particularly useful if a product could be equipped with a monitor that can determine if it has entered, or is about to enter, the wearout region of its life. Such a monitor is called a prognostic cell because it is capable of predicting impending failure. Preliminary work on development of prognostic cells was performed by Rome Laboratory (Air Force Materiel Command) as described in V.C. Tyree, "Self stressing test structure cells", Rome Laboratory, Air Force Materiel Command, New York February 1995. These preliminary cells (RADC TDDB cells) provided no metric or methodology for relating the amount of excess stress applied to stress the prognostic cell to the remaining useful life of the host circuit. Furthermore, these cells provided no technique for addressing the wide distributions associated with IC failures.

SUMMARY OF THE INVENTION

The present invention provides an IC chip with a prognostic cell that predicts when the chip is entering or is about to enter the wearout region of its life.

This is accomplished with an IC including a useful circuit having a component that is subject to failure in response to operational stress. The IC also includes a prognostic cell that is statistically designed to fail under increased stress. The increased stress applied to the prognostic cell is correlated to the operational stress of the useful circuit so as to achieve triggering of a failure indicator a "prognostic distance" ahead of the wearout region of the component. The prognostic distance may be more precisely defined as the time difference $t2-t1$ where $t2$ equals the time at which the cumulative failure probability $C(t)$ of the useful circuit component has increased to a tolerable fraction $f2$ of host IC failures and $t1$ equals the time at which the cumulative trigger probability $P(t)$ of the prognostic cell has increased to a tolerable fraction $f1$ of non-accurate predictions. The required increase in operational stress is a function of the prognostic distance and is correlated to the stress applied to the useful circuit so that the failure of the prognostic cell, although accelerated, tracks the stress on the useful circuit. The cell triggers a failure indicator as a predictor of impending failure of the component.

In an exemplary embodiment, the prognostic cell comprises a test device having a test component, a coupling circuit that couples the operational stress applied to the useful circuit to the test device, and a stress circuit that increases the operational stress to accelerate deterioration of the test component. A comparison circuit compares a performance characteristic of the test component to a baseline, determines whether the test component has failed and generates the failure indicator. In certain embodiments, the baseline is provided by a reference device that is subjected to reduced operational stress. To reduce statistical variation in the failure indicator, the prognostic cell may use a plurality of test devices to oversample the underlying trigger distribution, in which case the comparison circuit triggers the failure indicator when a certain fraction of the plurality fail.

In another embodiment, the prognostic cell has a trigger probability density $p(t)$ with a standard deviation that affects an amount of useful lifetime sacrificed by a premature trigger and/or a fraction of missed failure predictions of the useful circuit by late triggers. The fraction $f1$ may, for example, be set close to unity so that the fraction of missed failure predictions is small. The comparison circuit triggers the failure indicator when a certain fraction of redundant test devices fail thereby reducing the standard deviation of the trigger point distribution and the amount of useful lifetime sacrificed.

In another embodiment, the prognostic cell is used to identify any latent damage to a useful circuit and to predict its remaining useful life. This is done by increasing the operational stress on the cell off-line until the test component fails without stressing the useful circuit. The prognostic distance is then calculated off-line based on the amount of time the stress must be applied for the test component to fail. The calculated prognostic distance is a measure of the remaining useful life of the useful circuit. Since this process destroys the prognostic cell, the host IC may include multiple prognostic cells.

In another embodiment, an oversampled prognostic cell is provided with multiple readout capability. Multiple readout of each device failure supports off-line diagnostics for generating the bath-tub curve, more refined degradation as a function of changes in operating conditions, and off-line warranty analysis.

In other embodiments, the prognostic cell is used to monitor latent time dependent dielectric breakdown (TDDB) of the gate insulator, ESD damage, leakage under the field oxide due to ionizing radiation degradation, threshold voltage shift due to radiation damage, hot carrier damage and metal migration damage.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a prognostic cell to predict impending failure (complete failure or degradation outside a specified region of operation) of a useful circuit or circuits in a host IC. Increasing the use or environmental stress on the prognostic cell relative to the useful circuit, shifts the failure distribution of the cell along the time axis. The relative amount of time between the useful circuit failure and prognostic cell trigger point is the "prognostic distance". The prognostic distance of the prognostic cell is controlled by designing in the excess stress applied in test device(s), by setting the threshold for triggering in the comparison circuit or by both. The amount of excess stress and/or the threshold setting required can be determined using statistical modeling and measurement data. Prediction accuracy is enhanced by oversampling, i.e. using multiple test devices and setting the trigger point when a certain fraction fails.

Figure 1:
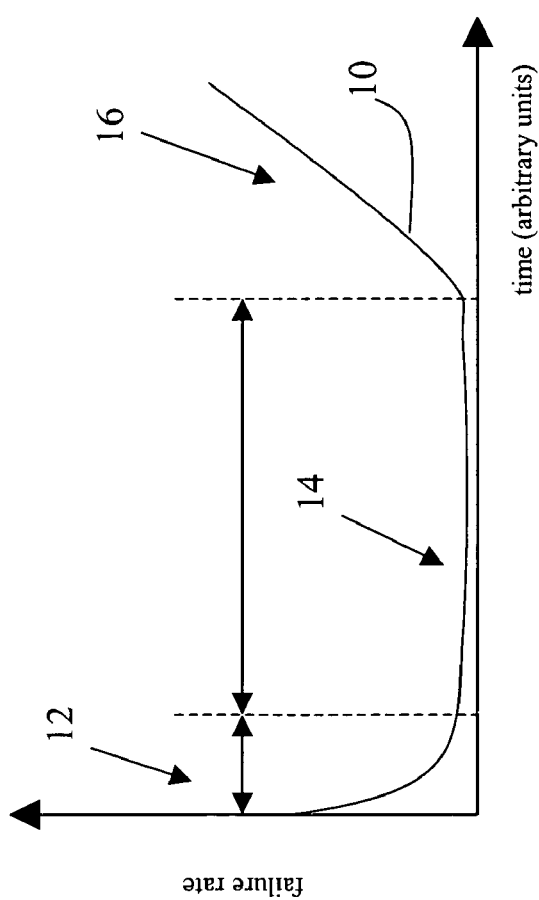
FIG. 1, as described above, is a failure probability distribution curve, commonly called a bathtub curve, for an IC.
Figure 2:
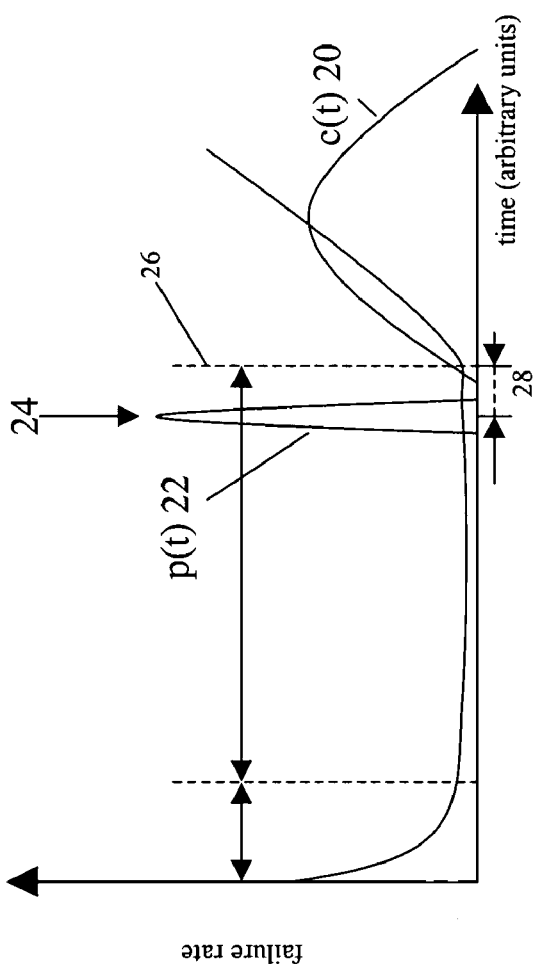
FIG. 2 is a bathtub curve illustrating a trigger probability density p(t) and a prognostic distance for predicting impending failure of the useful circuit in accordance with the present invention.

As shown in FIG. 2, the failure probability density c(t) 20 of the useful circuit and the trigger probability density p(t) 22 of the prognostic cell are superimposed on the bathtub curve 10. The relative amount of time between the useful circuit failure 26 and prognostic cell trigger point 24 is the prognostic distance 28. The prediction of useful circuit failure based on the trigger point and the prognostic distance is a statistical prediction that may and probably is somewhat inaccurate in any one sample. First, the amount of excess stress required to achieve a given prognostic distance is based on statistical modeling and measurement data. Second, in any one sample the cell can trigger anywhere on the trigger probability density p(t) 22. Third, in any sample the useful circuit can actually fail anywhere on the failure probability density c(t) 20. Even so the usefulness of the prediction of impending useful circuit failure is improved greatly by the definition of a prognostic distance and by applying a certain amount of stress to the prognostic cell required to trigger failure of the cell at the given prognostic distance. Oversampling reduces the spread of the density p(t) thereby improving prediction accuracy.

Figure 3:
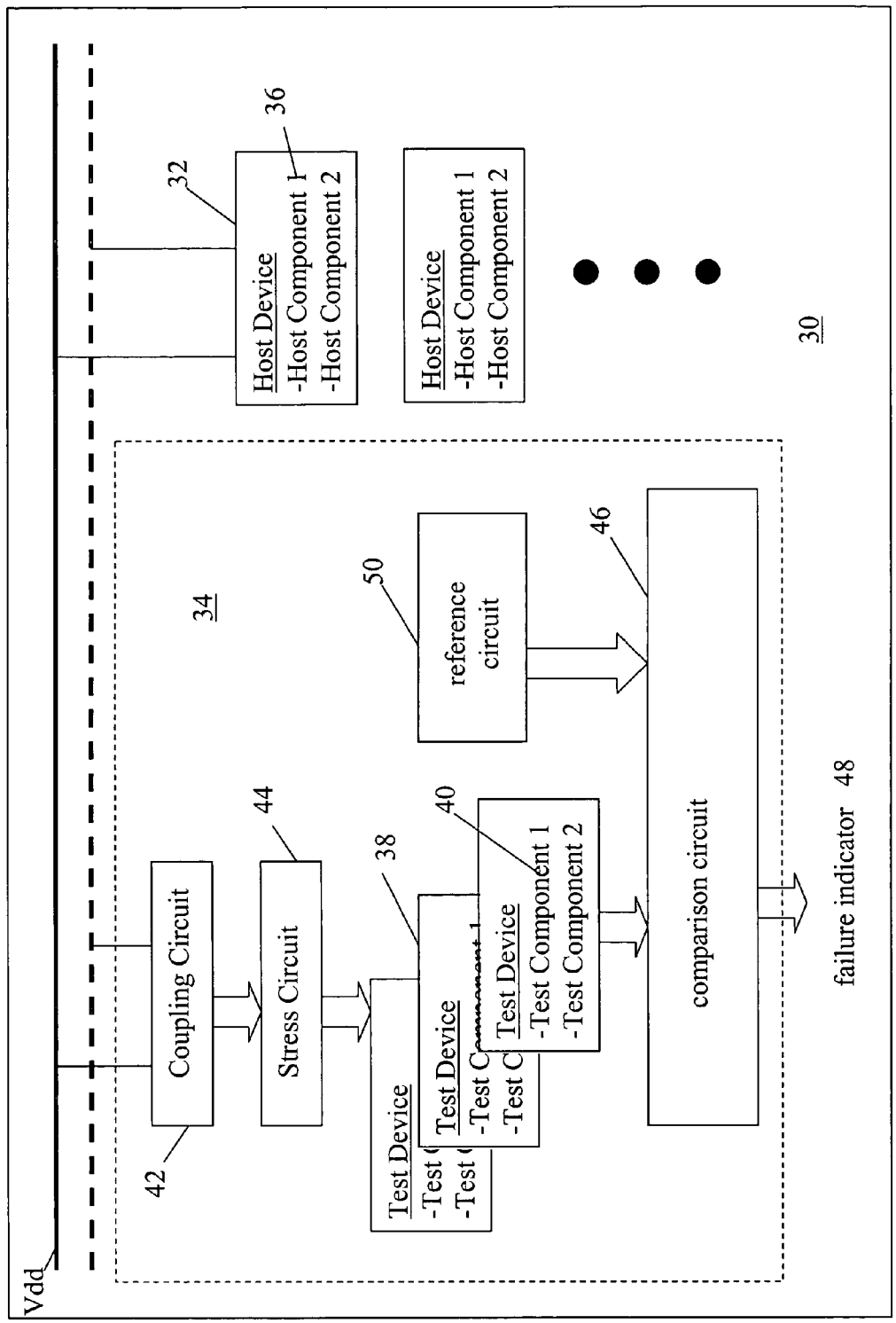
FIG. 3 is a functional block diagram of a prognostic cell.

As shown in FIG. 3, a host IC chip 30 includes a useful circuit 32, typically many thousands of them, and a prognostic cell 34. These two circuits operate in the same environment. They have been manufactured in the same or in a similar process technology. They use the same power supply and are in close enough proximity so that they experience the same level of thermal and voltage stress or radiation effects. The useful circuit(s)32 has one or more components 36 such as gate insulators, which may be formed by silicon dioxide, hafnium dioxide, hafnium silicate or similar materials, metal interconnect lines, field oxides and isolation oxides that are subject to failure or degradation of varying performance characteristics, e.g. resistance, current or voltage, in response to use or environmental stress.

Prognostic cell 34 includes one or more test devices 38 having one or more test components 40. The test device may or may not be the same as the useful circuit. For example, capacitors will be commonly used to monitor the degradation of transistors in the host IC. What is required is that the test component 40 be similar to the host component 36 so that they exhibit the same failure mechanisms and properties. For example, a capacitor's spacer insulating layer will exhibit the same degradation as a transistor's gate insulator. The spacer insulating layer may have different parameters such as physical dimension to facilitate more accurate measurement of degradation.

For the triggering of the cell to have meaning, the excess stress applied to the cell must be correlated to or "track" the actual stress applied to the useful circuit. To this end, prognostic cell 34 includes a coupling circuit 42 that couples the operational stress applied to the useful circuit to the test device. For example, the coupling circuit may couple the supply voltage Vdd, a drive signal, e.g. a gate bias or a clock signal, or a stress event outside normal operating conditions, e.g. an ESD event, from the useful circuit to the test device. As these conditions change, occur or are suspended, they are coupled to the cell and reflected in the excess stress applied to the cell.

Prognostic cell 34 includes a stress circuit 44 that increases the operational stress to accelerate deterioration of the test component 40. For example, the stress circuit may increase the supply voltage, alter the drive signal or prolong/intensify the stress event to increase the operational stress applied to the test device. The amount of excess stress is a function of the prognostic distance, the larger the distance the greater the required stress, and the degradation or failure mechanisms of the particular devices, and is determined using statistical models and testing.

The cell includes a comparison circuit 46 that compares a performance characteristic, e.g. a voltage or current, of the test component to a baseline, determines whether the test component has failed and generates the failure indicator 48. In certain embodiments where degradation is measured against a fixed value, the baseline is provided as a threshold in the comparator itself. In other embodiments where degradation is relative, the baseline is provided by a reference device 50 that is subjected to reduced operational stress. The reference device may be subjected to average, minimal or even no stress depending upon the application.

Figure 4:
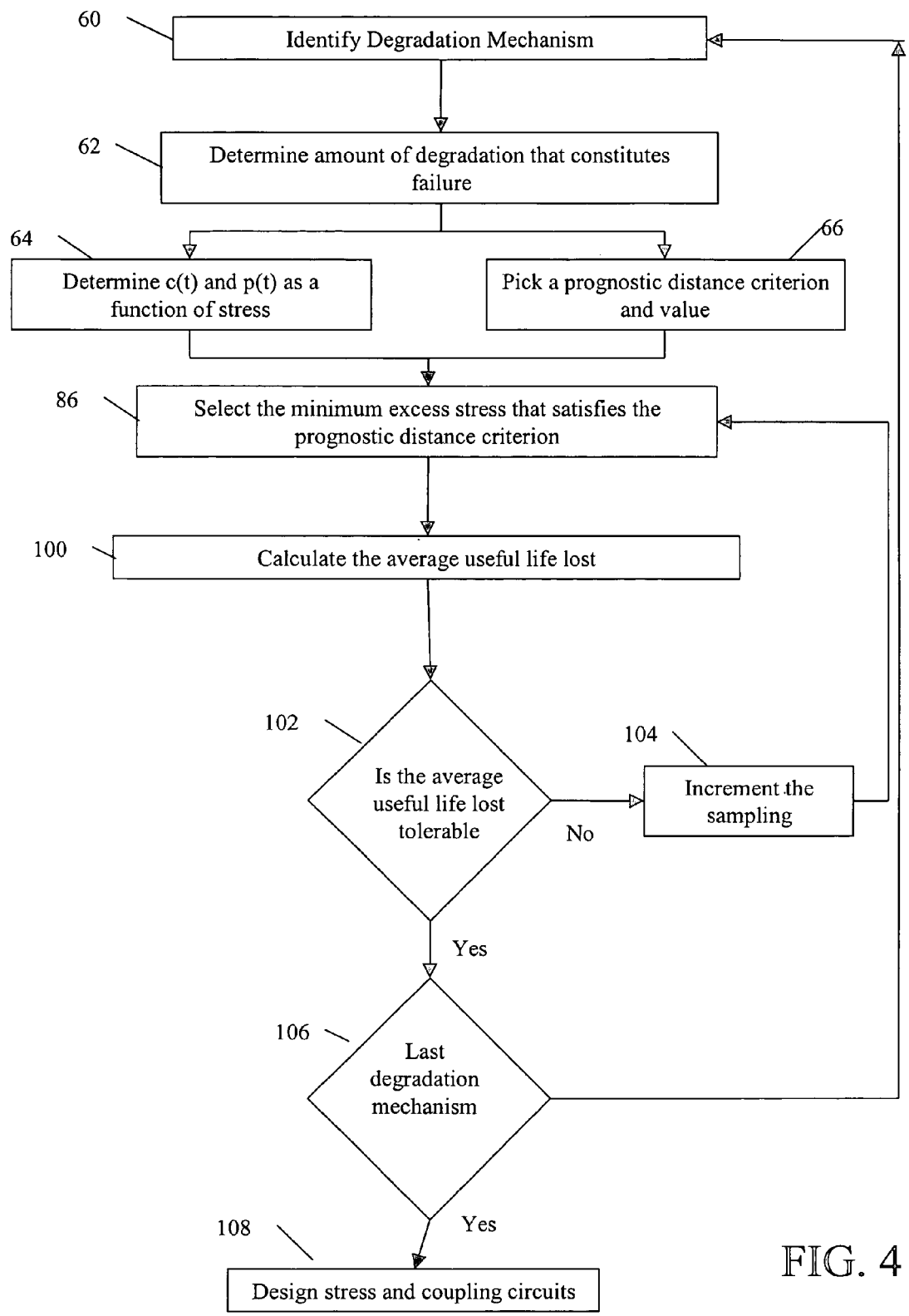
FIG. 4 is a flowchart of the design process of the prognostic cell.

As illustrated in FIG. 4, a prognostic cell for a particular application is designed for a particular useful circuit and degradation mechanism(s), amount of tolerable degradation, prognostic distance criterion and value and acceptable loss of useful life. The design starts by identifying a degradation mechanism (step 60). For example, a gate insulator may be susceptible to degradation from constant exposure to normal operating voltages and from periodic exposure to high voltage ESD pulses. Next, the designer determines the amount of tolerable degradation for the degradation mechanism selected (step 62). For example, a change in leakage current greater than 5% may be deemed a failure or a complete gate insulator breakdown.

Figure 5:
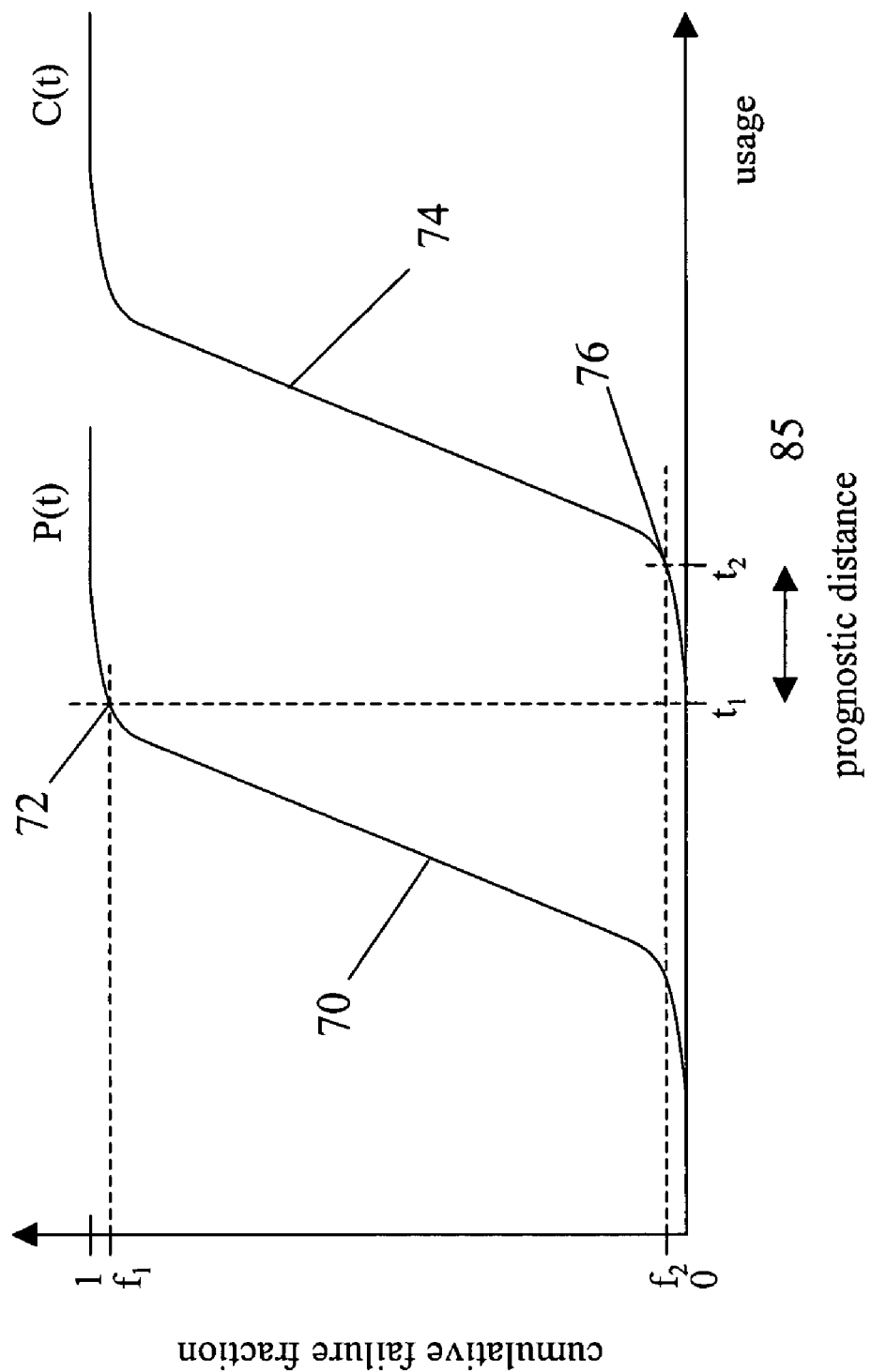
FIG. 5 is a plot of the cumulative failure probability C(t) of the useful circuit and cumulative trigger probability P(t) of the prognostic cell.

Thereafter, the designer must determine the failure probability densities c(t) and p(t) as a function of stress and excess stress (step 64) and pick a prognostic distance criterion and value (step 66). As shown in FIG. 5, the cumulative trigger probability P(t) 70 of the prognostic cell will typically reach a value f1 72 close to unity before the cumulative failure probability C(t) 74 of the host device will have started to increase beyond an acceptable value f2 76. Alternately, to get a very short prognostic distance they may overlap. The criterion is determined by the selection of f1 and f2 to balance a tradeoff between useful life lost and inaccurate predictions, e.g. the useful circuit fails before the predicted failure. The value will depend upon the particular application.

Figure 6:
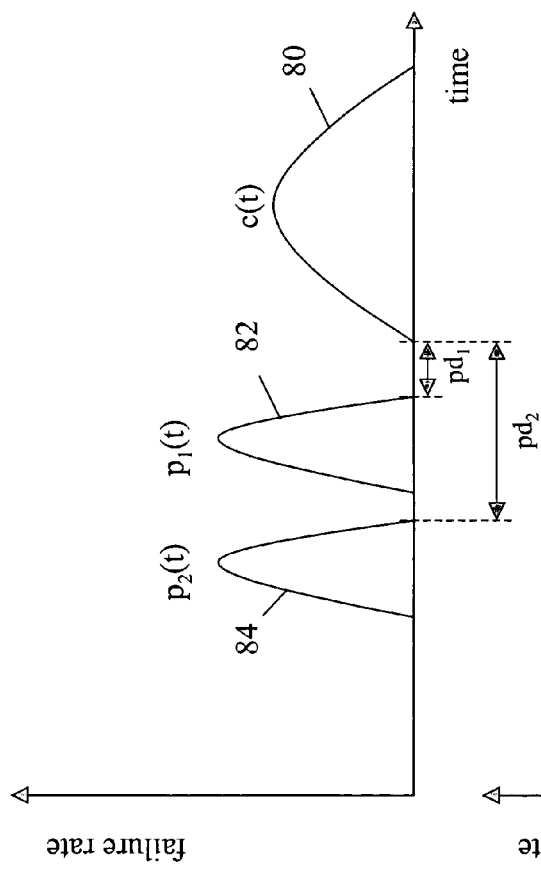
FIG. 6 is a plot of the failure probability density c(t) of the useful circuit and trigger probability density $p_1(t)$ and $P_2(t)$ for two different prognostic distances.

The failure probability density 80 shown in FIG. 6 is given by:

$$c(t) = \frac{dC(t)}{dt},$$

and the trigger probability densities 82 and 84

$$p(t) = \frac{dP(t)}{dt}$$

for different amounts of excess stress. The larger the excess stress the more p(t) will shift in time.

The cumulative distributions C(t), P(t) and probability densities c(t), p(t) are determined statistically by measuring the degradation of a large number of test devices under varying degrees of stress and accumulating the failure results into histograms.

A prognostic cell is only useful if the prognostic distance can be controlled within reasonable limits. All integrated circuit failure mechanisms are statistically distributed in time. This means that identical integrated circuits operating under identical conditions will still have a distribution of failure times. The prognostic distance is therefore defined in terms of statistical parameters:

$f_1$=tolerable fraction of non-accurate predictions by the prognostic cell $f_2$=tolerable failure fraction of the circuit $t_1$=time at which a fraction $f_1$ of the prognostic cells have triggered $t_2$=time at which the failure probability of the useful circuit has increased to an unacceptable level ($f_2$).

As shown in FIG. 5, an absolute prognostic distance $85 = t_2 - t_1$.

Alternately, a relative prognostic distance $$\frac{t_2 - t_1}{t_2}.$$

The relationship between $f_1$ and $t_1$ and between $f_2$ and $t_2$ is given as:

$$P(t_1) = f_1$$

$$C(t_2) = f_2$$

$(t_1) = f_1 \Rightarrow t_1 = P^{-1}(f_1)$ $C(t_2) = f_2 \Rightarrow t_2 = C^{-1}(f_2)$ From which the absolute prognostic distance=$t_2 - t_1 = C^{-1}(f_2) - P^{-1}(f_1)$ and the relative prognostic distance=

$$\frac{t_2 - t_1}{t_2} = \frac{C^{-1}(f_2) - P^{-1}(f_1)}{C^{-1}(f_2)}.$$

From accumulated test date for p(t), the designer selects the minimum excess stress that shifts p(t) along the time axis to satisfy the prognostic distance for the given criterion (step 86 in FIG. 4). This can be accomplished with the aid of statistical models for the failure mechanisms of interest for the particular devices and components. In addition, a number of devices and components will typically be subjected to varying values of excess stress to generate actual data that can be used.

Figure 7:
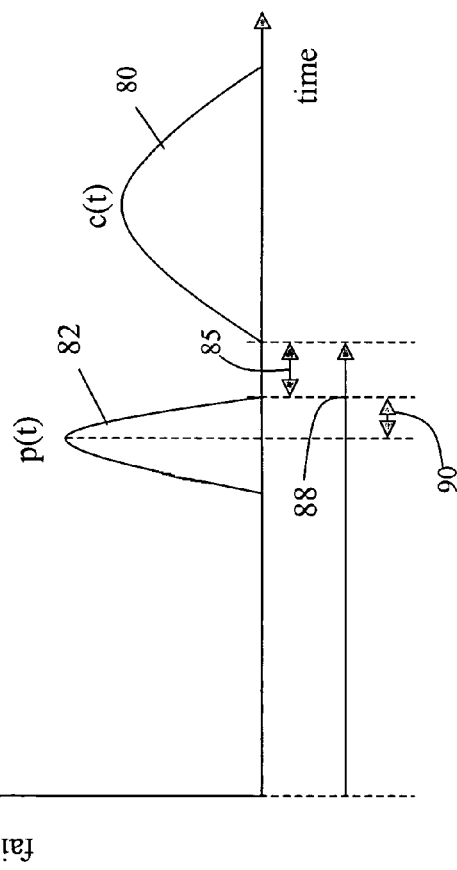
FIG. 7 is a plot of p(t) and c(t) illustrating useful life lost.

As shown in FIG. 7, the spread of the distribution p(t) 82 is important, since it determines the amount of useful lifetime 88 that is sacrificed to achieve the prognostic distance. The average useful life lost 90 is the difference between the designed trigger time t1 and the average actual trigger time tavg. If, as shown here, the trigger time t1 is set so that the distribution P(t) is close to unity to avoid the useful circuit failing before the predicted time, the average useful life lost will be fairly large. The cell is designed to make a conservative prediction. If, however, the trigger time t1 was set so that the distribution P(t) was at 0.50, the average useful life lost would be zero (assuming a symmetrical density). The tradeoff is that the risk of the host device failing early increases substantially. This is a design trade-off made based on a particular application. Note, that the actual useful life lost may be more or less than the average for any single sample.

Figure 8:
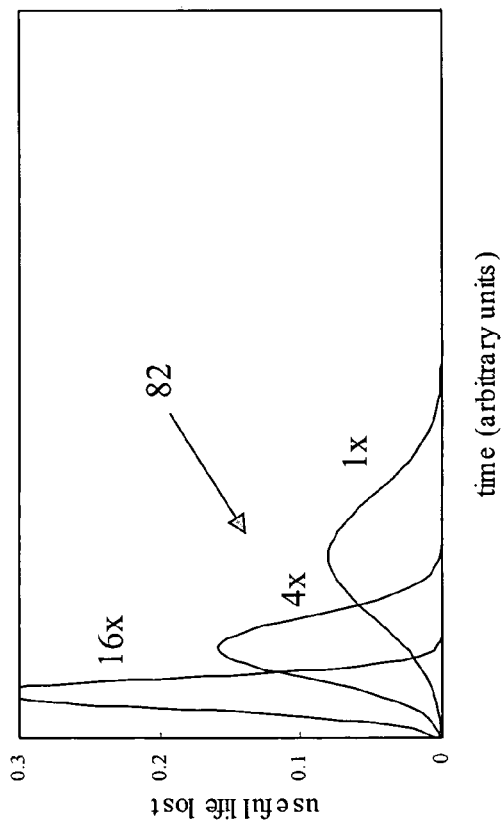
FIG. 8 is a plot of p(t) for 1×, 4× and 16× oversampling.

As shown in FIG. 8, the spread of the distribution p(t) 82, hence the average useful life lost, can be reduced (i.e. improved for the purposes of a prognostic cell) by oversampling, e.g. adding test devices and triggering the failure indicator when a certain fraction 1, N/2, N, etc. have failed. Oversampling is a powerful tool for reducing the amount of useful life lost and thus making useful predictions of impending failure. This is particularly important where distribution of failures of the test devices can be broad. This is the case, for example, for gate insulator failures due to TDDB (or TDDB combined with ESD damage). Oversampling also shifts the mean of the distribution along the time axis. As a result, the different oversampled distributions (1×, 4×, 16×) require different amounts of excess stress.

Next, the designer calculates the average useful life lost from the circuit failure distribution c(t) and the failure distribution p(t) at the selected stress (step 100) for an initial increment, typically 1×. If the average useful life lost is not tolerable (step 102 of FIG. 4), the sampling is incremented (step 104 of FIG. 4) (more test devices included) and the minimum stress recalculated. If tolerable, the designer determines whether there are any more stresses to consider (step 106 of FIG. 4). For example, in an ESD circuit both the voltage supply and any ESD events are couple to the test device. If so the entire process is repeated. Once all the degradation mechanisms are evaluated, the number of test devices determined, and the amount of excess stress calculated, the designer designs the coupling and stress circuits (step 108).

EMBODIMENTS OF THE PROGNOSTIC CELL

The prognostic cell can be designed for a wide variety of IC applications of which six examples are presented.

TDDB Prognostic Cell

Time dependent dielectric breakdown (TDDB) of a gate insulator such as silicon dioxide is known to be exponentially dependent on the electric field. Acceleration of the breakdown can therefore be achieved by applying a somewhat larger voltage than the supply voltage to a test capacitor. When the test capacitor fails, a certain fraction of the circuit lifetime has been used up. The fraction of useful circuit life that has been used up is dependent on the amount of overvoltage applied and can be estimated from the known distribution of failure times. The higher the overvoltage that is applied to the test capacitor, the faster the test capacitor will fail relative to the circuit. A statistical model for gate insulator breakdown as a function of applied voltage is therefore necessary if a prognostic cell with a proper predictive distance is to be designed. A statistical model has been derived based on the "E model". If the prognostic distance is defined as 99% of prognostic cells must fail before 1% of the useful circuits fail by a time equal to 10% of the total useful life, then the prognostic distance of a prognostic cell for TDDB can be related to the necessary overvoltage by:

$$\Delta V_G = \Delta E t_{ox} = (E_{ox,prog.cell} - E_{ox,circuit}) t_{ox}.$$

$$= \frac{t_{ox}}{\gamma} \text{Ln}\left[\frac{10}{9}\left(\frac{A_{circuit}}{A_{prog.cell}}\right)^{\frac{1}{\beta}}\left(\frac{\text{Ln}(1-0.99)}{\text{Ln}(1-0.01)}\right)^{\frac{1}{\beta}}\right] \quad (1)$$

where $V_G$=gate voltage $t_{ox}$=gate insulator thickness $E_{ox}$=gate insulator field $\gamma$=field acceleration parameter $\beta$=shape parameter A=gate area Equation 1 is a design equation for the TDDB prognostic cell, since it gives the excess stress voltage ($\Delta V_G$) that is required for a given prognostic distance.

For a silicon dioxide gate insulator, the parameters necessary to describe the oxide failure distribution depend only on the oxide thickness. It is therefore possible to estimate the parameters for a particular process by reviewing literature data for similar oxide thickness values. The TSMC 0.25 μm process has oxide thickness 5.6 nm. We have used the γ value reported in M. Kimura, "Field and Temperature acceleration model for time-dependent dielectric breakdown," IEEE Trans. Electron Devices, vol. 46, pp. 220-229, 1999 for 6.1 nm oxide thickness and have extracted the C' value from data reported therein (Table 1). It is not possible to determine β values accurately using capacitors that are all of the same size unless extremely large sample sizes are used. Because of this, reliable estimates of β could not be obtained using literature data. Capacitor samples with an oxide thickness of 6.5 nm were obtained from Sandia National Laboratory (SNL). Time to breakdown was measured on these samples for five sets of capacitors with different areas at 8V stress voltage. Because the wide range in available capacitor areas is exploited, this data contains the same information (for purposes of determining the TDDB statistics) as a set of 50,000 capacitors of a single size! The β value that is extracted from a fit is 3.2.

The values used to design a prognostic cell for the TSMC 0.25 μm process are given in Table 1. These are reasonable estimates, but should be verified using test capacitors fabricated in the actual process so that the TDDB prognostic cell can be optimized. A prognostic cell and its useful circuit operate at the same temperature. For a first order design, it may be assumed that the temperature dependence of the oxide breakdown can be neglected. For more accurate modeling of the failure distribution and the prognostic cell, $E_a$, the temperature dependence of γ and the field dependence of $E_a$ must also be determined.

TABLE 1

Current best estimate values for intrinsic TDDB distribution
for the TSMC 0.25 μm process gate oxide.

| Distribution parameter | value | source |
|---|---|---|
| Γ | 2.9 MV/cm | Kimura |
| C' Exp[Ea/kT] | $3.8 \; 10^{-14}$ s | Kimura |
| B | 3.2 | Measurements |

For the TDDB parameters of the TSMC 0.25 μm process (Table 1), and for an area ratio of $10^4$ (that is, if the total circuit gate oxide area is ten thousand times larger than the TDDB prognostic cell test oxide), the excess stress voltage is 0.9 V (for a total stress voltage of 3.4 V). This could not be controlled using the RADC TDDB cell, but can easily be achieved using the modified TDDB prognostic cell in accordance with the invention.

Figure 9:
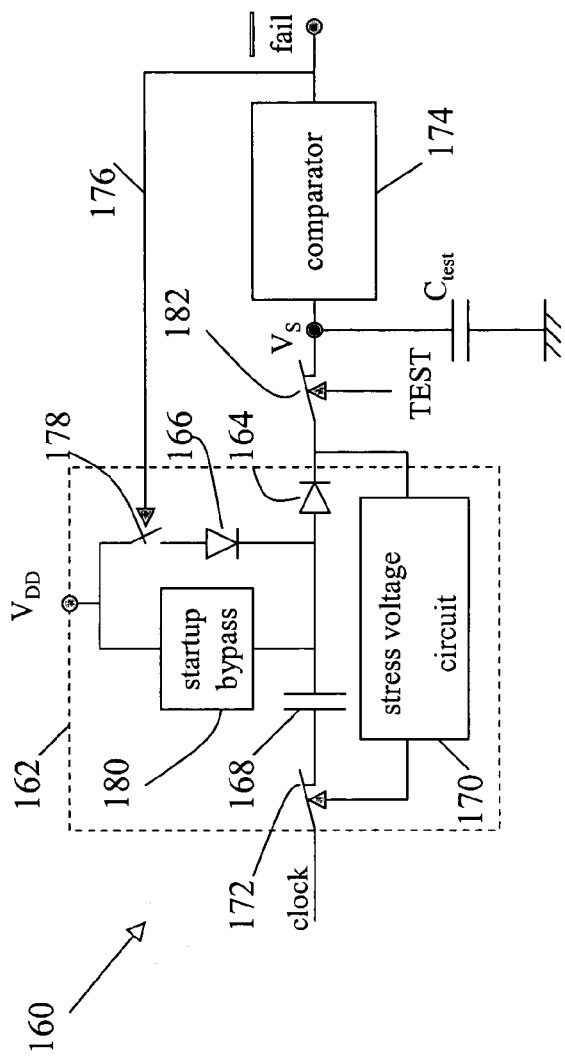
FIG. 9 is a schematic of a TDDB prognostic cell.

A TDDB prognostic cell 160 is shown in FIG. 9. The design challenge for the TDDB cell is to apply sufficient, but not over pessimistic, stress voltage to the test capacitor $C_{test}$ to enhance its gate insulator failure without stressing the gate insulator of other transistors in the prognostic cell or IC. The constraint of having only a single power supply, $V_{DD}$=2.5 volts, forces the need to generate a higher on chip potential in such a way that it does not affect any other component on the chip. This is accomplished by designing a well bias circuit ("charge pump") 162 that will pump the well containing the test circuitry to create a larger total potential across the gate insulator of the test transistor $C_{test}$ than the power supply voltage $V_{DD}$. A pair of diodes 164 and 166 and a capacitor 168 form the charge pump. A stress voltage circuit 170 connected in a feedback loop accurately controls the stress voltage by controlling a switch 172 driven off a clock signal to turn the pump on and off. If failure of the test capacitor is indicated (by a drop in the stress voltage), a comparator 174 sets the output bit low and a second feedback loop 176 shuts down the charge pump (to avoid excess power consumption in this stage) by closing/opening switch 178. A startup bypass circuit 180 is used to apply a voltage somewhat above the ground level when the power supply is turned on to start the charge pump.

If the breakdown resistance of the test capacitor is high enough and the charge pump strong enough to prevent the voltage on the test capacitor from changing sufficiently to trigger the comparator, a TEST signal is used to temporarily disconnect the capacitor from the charge pump using a switch 182. This allows the charge to bleed off of the test capacitor through the breakdown resistor sufficiently for the comparator to detect breakdown.

ESD Prognostic Cell

ESD is a major reliability issue for microelectronics. There is currently no practical way to screen devices for latent ESD damage. The prognostic cell provides a non-destructive technique for monitoring latent ESD and TDDB damage that will be useful for many high-reliability applications. The measurement of remaining useful life can be performed by increasing the stress voltage. A timer measures the amount of time remaining at accelerated voltage relative to a reference gate insulator. The reference gate insulator is an identical gate insulator (on the same chip) that can not be exposed to any ESD events. However, this remaining useful life measurement is destructive to the latent ESD damage detector. If it is desired to do the measurement more than once, multiple independent detectors can be placed on the same IC.

Figure 10:
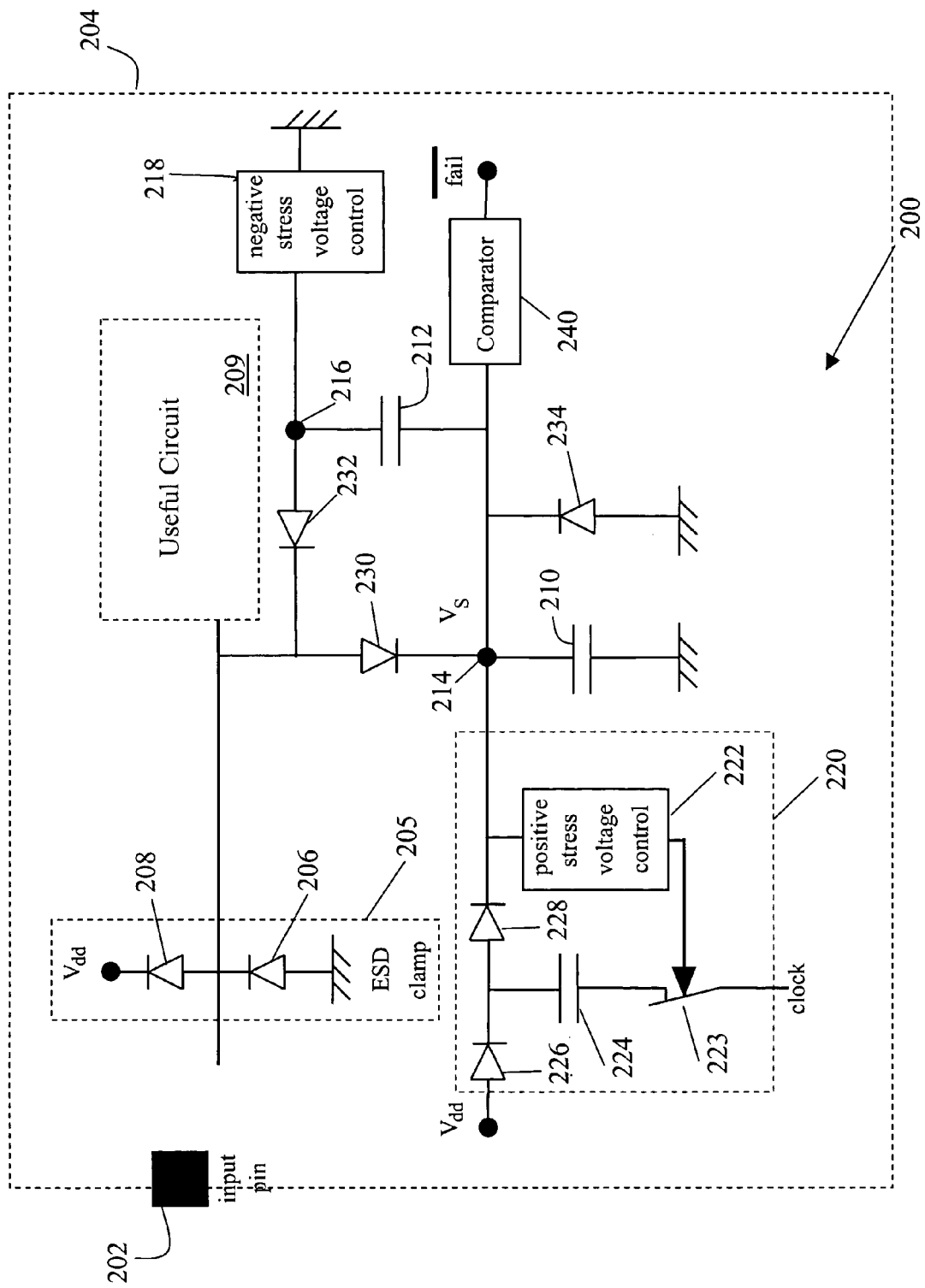
FIG. 10 is a schematic of an ESD latent damage prognostic cell.

An example of an ESD prognostic cell 200 for electrostatic discharge (ESD) at an input pin 202 of an IC 204 is shown in FIG. 10. An ESD clamp, such as the standard ESD clamp 205 consisting of diodes 206 and 208, connected in series between ground potential and the high voltage supply Vdd, is used to dampen any ESD events to protect the useful circuits 209. However, some ESD events are insufficiently dampened and may damage the useful circuits, hence the IC thereby causing or accelerating degradation and failure. In this example, the prognostic cell predicts impending failure of the gate insulator of the transistors in the IC based on a combination of (a) ordinary operational stress due to the Vdd potential applied to the gate insulator and (b) extraordinary stress due to spikes in the potential caused by ESD events.

In this particular embodiment, the prognostic cell is designed to function whether the IC power supply pin is connected to the high voltage supply Vdd (the IC is powered) or is left floating (the IC is not powered). If the power supply pin is left floating, then it is capacitively coupled to the ground potential via parasitic capacitances of the power lines. The prognostic cell degrades under both positive and negative ESD events on the input pin, and thus includes a pair of test devices and coupling circuits.

The cell includes test capacitors 210 and 212. Each capacitor has an insulating spacer layer that is similar to the useful circuit's gate insulator. Capacitor 210 is connected between ground potential and a node 214. Capacitor 212 is connected between node 214 and a node 216 that is held by a negative stress control circuit 218 at or below ground potential.

The normal operational stress of the supply voltage is coupled to the test capacitors by simply operating the prognostic cell off of the same supply voltage, either Vdd or ground potential. The stress voltage $V_s$ at node 214 is raised to a value higher than $V_{dd}$, as determined by the required prognostic distance, either by an external voltage source or by an on-chip charge pump 220. As in the TDDB prognostic cell, the exact level of $V_s$ is controlled using a stress voltage control circuit 222 that controls a switch 223 to turn the pump on and off. When the charge pump is on, charge from $V_{dd}$ moves across a diode 226 onto a capacitor 224 and is pumped across a diode 228 onto node 214. As with the TDDB cell shown in FIG. 9, the ESD cell's charge pump may include a switch (not shown) to periodically disconnect the charge pump and allow the capacitor to be measured.

The ESD stress is coupled onto the capacitors with a pair of diodes 230 and 232. Diode 230 is connected between the input pin and the top of capacitor 210 at node 214. In normal operation this diode is reverse biased (no coupling). However, the occurrence of a positive ESD event at the input pin causes the voltage on the input pin to spike high and forward bias the diode thereby coupling the ESD event to node 214 and further increasing the voltage (stress) applied to capacitor 210. The capacitance in the circuit also holds the voltage spike across the capacitor to prolong the affect of the ESD event on the test capacitor. The rate at which the ESD event voltage decays is determined by the positive stress voltage control. Similarly, diode 232 is connected between the input pin and the bottom of capacitor 212 at node 216. In normal operation the negative stress control circuit couples node 216 to the ground potential. However, the occurrence of a negative ESD event at the input pin causes the voltage to spike low and forward bias diode 232 thereby coupling the ESD event to node 216 and further increasing the voltage (stress) applied to capacitor 212. Diode 234 prevents node 214 from being coupled negative. The negative stress control circuit allows node 216 to briefly assume negative voltages, for example by making the negative stress control circuit a low-pass filter.

Figure 11:
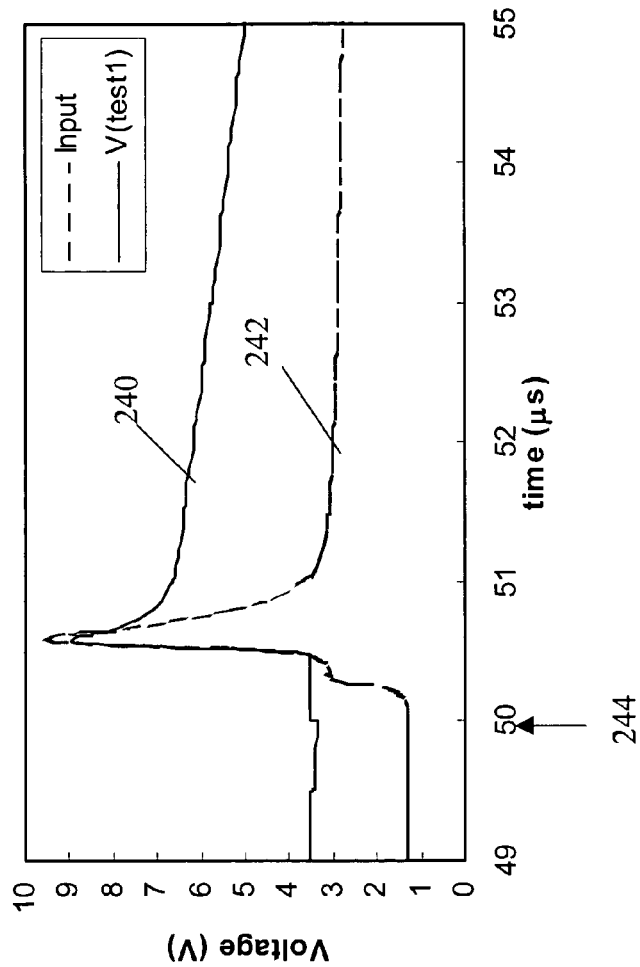
FIG. 11 is a plot of the excess stress in an ESD prognostic cell.

As shown in FIG. 11, the stress voltage 240 at node 214 is greater than the operational voltage 242 at the pin, both before and after a positive ESD event 244. Both the continuous stress associated with normal operation and the transient stress associated with an ESD event are coupled to the test capacitor and increased to place excess stress on the test capacitor.

The measurement of the remaining amount of useful lifetime is a straightforward TDDB measurement. A comparator 240 compares the voltage at node 214 to an internal threshold and, if failure is indicated by a breakdown or enough degradation of one of the test capacitors, sets the fail output bit to 0 (i.e. a fail bit set at $V_{dd}$ means "everything ok"). Calibration tables with the correct field prognostic distance for applied excess stress will give the amount of remaining useful lifetime.

As described a single ESD prognostic cell can monitor an entire chip. Only two diodes need to be added per input pin to be monitored. The entire prognostic cell is expected to be tiny relative to the host IC. Based on the design shown in FIG. 9, it should be no larger than the equivalent of about 20 latches. ESD protection and monitoring should not affect the characteristics of the input pin. The capacitance the ESD prognostic cell will add to the input pin is expected to be very small (only the reverse bias diode capacitance of the two diodes) and relatively independent of input voltage (because the two diodes are oriented in opposite ways relative to the input pin).

Field Leakage Radiation Prognostic Cell

Ionizing radiation has detrimental effects on the threshold voltage, leakage current and current drive capability of MOS devices. The magnitude of the effect depends on a large number of factors, including total radiation dose and energy, dose rate, applied bias during irradiation, device layout and fabrication, ambient temperature and anneal conditions. The manner and degree to which circuit functionality is affected, is likewise dependent on these factors. In general, circuit designers have to assure that circuit functionality is maintained over a range of device characteristics. When individual device behavior goes outside this range, circuit functionality is soon lost.

Radiation effects in MOS devices are dominated by charge trapping in insulating layers and interface state generation at insulator-silicon interfaces. Several dielectric layers in a MOS device can accumulate radiation damage and affect the device's electrical characteristics: the gate insulator, the isolation oxide and (for devices built using SOI technology) the buried oxide. Depending on which dominates the radiation response, radiation damage will manifest itself as a change in threshold voltage or in the leakage current (off current) of the MOS transistor. A change may also be observed in the drive current (on current) due to reduction in mobility, though this effect is not commonly observed in deep submicron CMOS processes even at very high irradiation levels. The dominant radiation effect depends both on the fabrication technology and design methodology. Charge trapping or interface state generation in the gate insulator results in a shift of the threshold voltage of a MOSFET. Charge trapping or interface state generation in the isolation oxide or buried oxide can result in a leakage path that is not turned off by the gate.

Isolation oxides are much thicker than gate insulators. Therefore, these oxides tend to be much more sensitive to ionizing radiation. Very little damage can be observed for oxides less than 10-15 nm thick. Modern commercial submicron CMOS processes have gate oxide thickness smaller than 10 nm. For typical advanced commercial CMOS processes, leakage under the field isolation due to inversion of the p-type substrate is therefore found to be the dominant radiation effect. This leakage current is observed well before the gate oxide starts to exhibit threshold voltage shifts.

Normally, the thickness of the field oxide increases the field threshold voltage enough to prevent an interconnect line at voltage $V_{DD}$ running across the field from inverting the silicon under the field oxide. Ionizing radiation results in positive charge being trapped in silicon dioxide. The positive charge trapping in the isolation oxide reduces the threshold voltage of the p-substrate field oxide: the positive charge in the oxide attracts electrons in the substrate, eventually (partially) inverting it. When the silicon under the field oxide is inverted, a leakage path is induced. Three leakage paths can be created. The first is "end-around" leakage between the source and the drain. This leakage path results in poor off characteristics for the NMOS devices. The second leakage path is leakage between two NMOS devices in the same p-well. Such a leakage path can result in current flow between two supposedly isolated devices in the circuit. The third leakage path is leakage between an nMOS device and a neighboring n-well.

Figure 12:
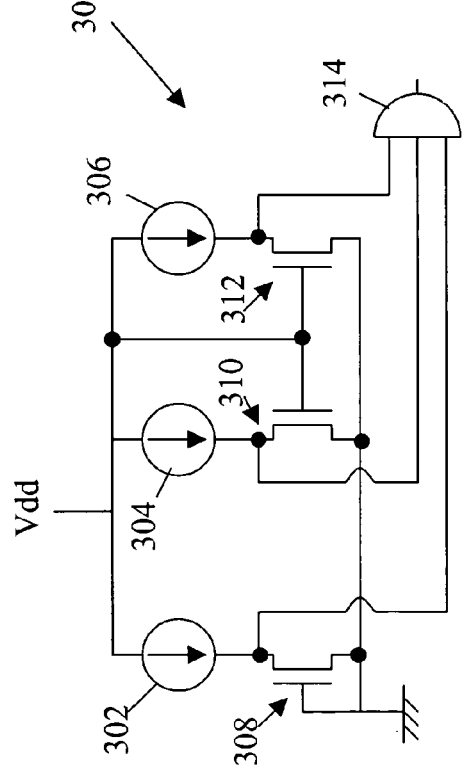
FIG. 12 is a schematic of a field oxide leakage radiation prognostic cell.

As shown in FIG. 12, a field oxide leakage prognostic cell, or Radcell FOX prognostic cell 300, addresses the three potential problem areas for leakage associated with the field oxide due to ionizing radiation degradation, since each of the three mechanisms is a potential killing defect for a circuit.

The prognostic cell may be configured to monitor all three areas simultaneously as shown or any one or two of the areas as dictated by the application.

Each potential leakage mechanism has a special monitor transistor structure that monitors it in its own branch of the circuit (N1, N2 and N3). Each branch consists of an inverter formed by a constant current source 302, 304 and 306, respectively, and a monitor transistor 308, 310 and 312, respectively. The drain of each monitor transistor is fed from the constant current source whose value is set to the allowed radiation degradation limit for that mechanism. If the leakage of the transistor under test is not degraded sufficiently by radiation, the transistor will not be able to sink the current from the current source and the output voltage of the inverter measured at the drain of the monitor transistor will be high. However, if the leakage of the monitor transistor has become sufficiently high due to degradation by ionizing radiation, it will be able to sink the current from its current source. The output of the inverter will be pulled low and this will be detected as the failure signal: The outputs of the three branches are tied together using a comparator configured as a logic "AND" circuit 314 so that the prognostic cell detects failure ($V_{out}$=low voltage) if one (or more) of the mechanisms has exceeded its specified level.

The key innovation for the cell is the successful design of an appropriate stress monitor transistor with an appropriate gate bias. Such stress monitors that mirror worst-case layout conditions have been designed for each of the three potential field leakage problems. A segmented gate transistor is used to monitor the end around leakage current and increase the detection limit. Minimum size field transistors for a modern submicron shallow trench isolation technology have been designed to address the other two mechanisms. The isolation oxide width (STI) is minimum length and that the poly is placed over the entire length of the isolation region. The monitor transistors are biased to worst case conditions for radiation damage.

Functionality was verified using SPICE simulation. When one of the monitor transistors' current-voltage characteristics degrades to such an extent so that it has a leakage current that is 50 nA or larger, the output voltage of the prognostic cell goes from 2.5 V to 0 V. This transition is the output that signifies that the leakage is about to enter a regime where the accompanying circuit is likely to fail. The 50 nA limit is arbitrary.

Threshold Voltage Shift Radiation Prognostic Cell (RadCell $V_T$)

Since the gate insulator is extremely thin in advanced commercial CMOS processes, it is much less sensitive to radiation damage than the field isolation oxide. However, the gate insulator can be limiting if the circuit is very sensitive to threshold voltage shifts. The gate insulator will also be limiting if radiation tolerant design techniques are used to ensure that nMOS transistors do not come into contact with isolation oxide (i.e. if annular devices protected by guard rings are used). When such design techniques are employed, there is no field edge for the nMOS devices, and hence the leakage path generated under the field oxide can never exist.

The electric field in the insulator has an important influence on the radiation effects because charge yield of the ionizing radiation, transport of charge carriers and trapping of charge carriers are all dependent on the electric field. The minimum radiation effects typically occur in a gate oxide when the gate voltage is equal to the metal-semiconductor work function difference. At this voltage, called the flatband voltage, the electric field in the oxide is essentially zero, and most electron-hole pairs generated by the ionizing radiation recombine before they can cause damage. If the electric field is positive, the holes are driven towards the Si—$SiO_2$ interface where they can be trapped and the radiation effects are large. If the field is negative, the holes are driven towards the gate and the radiation effects are much smaller. Generation of interface traps follows a similar behavior.

Good transistor matching is a very common requirement for analog circuits. Threshold voltage shifts due to gate insulator charge trapping due to ionizing radiation are particularly disturbing for such circuits. For example, pixel detectors, of particular importance in high energy particle physics experiments, are exceptionally sensitive to threshold voltage mismatch. Since the two matching transistors will not be operating under the same bias conditions, the two will experience different threshold voltage shifts when exposed to ionizing radiation. Monitoring the amount of mismatch during operation would be very useful to determine if the pixel detectors are still functioning within specified limits.

Radiation is uniform throughout the IC. It is, in other words, not possible to "turn off" the radiation for a reference device and compare that reference device to a degraded device. However, the amount of damage caused by ionizing radiation in a dielectric is dependent on the electric field present in the dielectric during radiation. By applying a different gate electric field to two (initially) matched devices, a mismatch in threshold voltage will be achieved after radiation exposure. This damage will manifest itself as a change in the drain current of the MOS device. The threshold voltage difference (after radiation) between a MOS transistor biased at best case versus one biased at worst case can be compared. Different gate bias for the stressed and unstressed transistors should be based on relevant observed radiation degradation for the intended process.

Such effects can be differences in radiation degradation for negative versus positive gates voltage, or on vs. off vs. dynamic bias differences in nMOS and pMOS devices. For instance, flatband gate voltage or ground voltage could be chosen as best-case bias during radiation and maximum positive gate bias could be chosen as worst case bias during the irradiation (though this must be verified experimentally, since it is not always true). The layout of the prognostic cell transistors follows the same pattern as those employed in the useful circuit (i.e. using annular devices and guard rings if that is what the host circuit employs).

While the field oxide dominates the radiation response of bulk standard CMOS processes, circuit layout can be done specifically for radiation hardness by employing annular, or closed gate structures. For this transistor layout there is no possible leakage path between source and drain and therefore the radiation damage will occur only in the gate insulator. The threshold voltage or transconductance shifts due to charge trapping in the gate insulator oxide are highly dependent on transistor bias, process technology and radiation environment.

Figure 13:
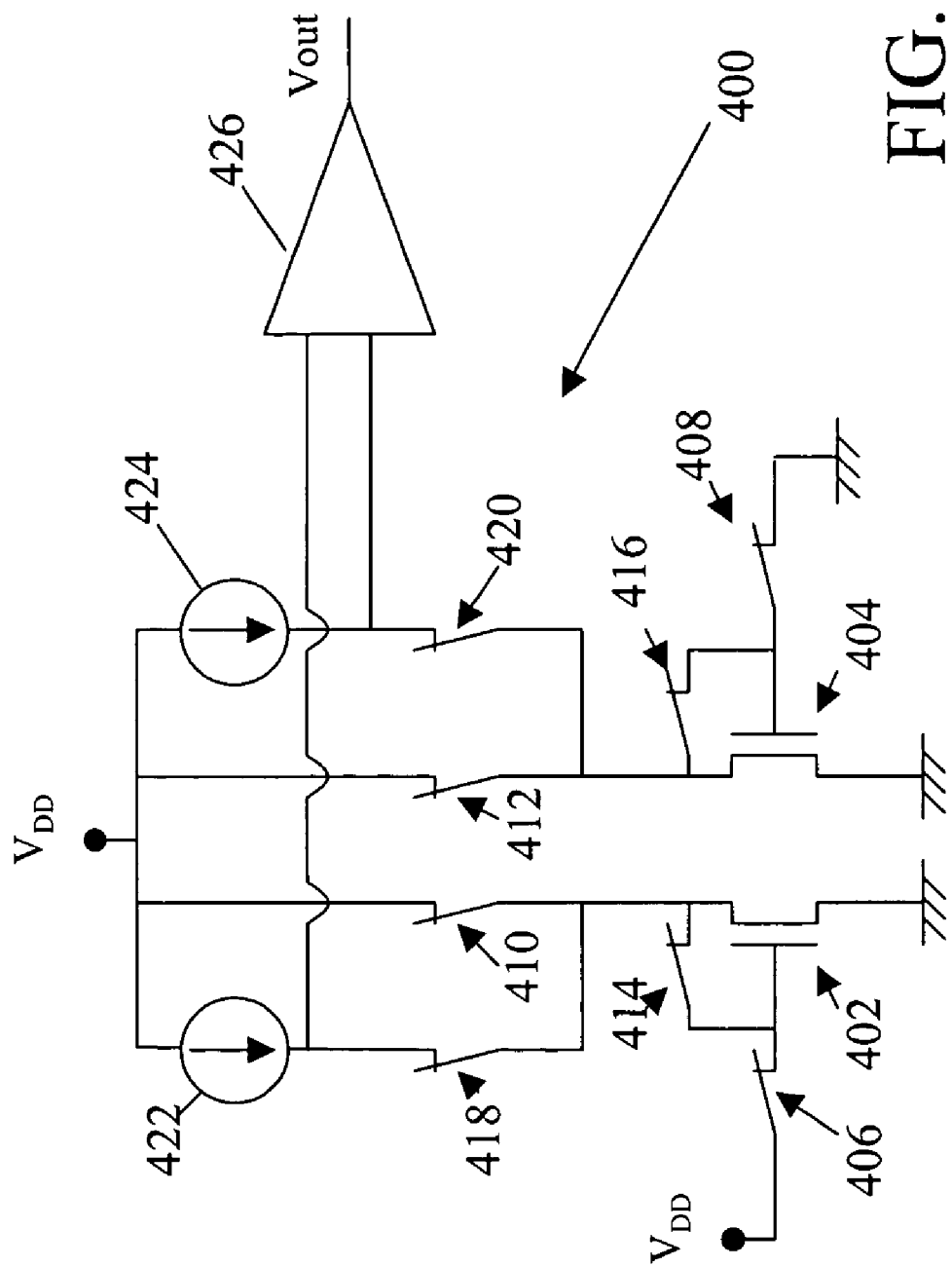
FIG. 13 is a schematic of a threshold voltage shift radiation prognostic cell.

As shown in FIG. 13, a prognostic cell 400 design employs the difference in radiation response of two monitor transistors 402 and 404 when different gate bias conditions are present. In fact, it is different bias conditions on the gate that result in increased transistor mismatch due to radiation which can be a major problem in analog circuits.

Thus, the prognostic cell addresses directly the failure mechanism in such circuits. During the stress cycle, switches 406 and 408 are closed to hold the two monitor transistors 402 and 404 at different gate bias and switches 410 and 412 are closed to connect the drains to Vdd. Switches 414, 416, 418 and 420 are all open. Because the two gate insulators have different electric fields while being subjected to ionizing radiation, they will exhibit a different amount of threshold voltage shift. Ideally, the test transistor 402 is stressed at the worst bias (which can only be determined by measurement), for example Vdd, and the reference transistor 404 is held at the flatband or the minimum damage bias condition, for example ground potential.

During the measurement cycle, the threshold voltage difference between the two monitor transistors is determined. Switches 406, 408, 410 and 412 are all opened. Switches 414 and 416 are closed to short the transistors' gates to their respective drains. Switches 418 and 420 are closed to supply current from constant current sources 422 and 424 to the respective drains and to connect a comparator 426 to measure the voltage difference at the drains. Comparator 426 triggers the output when the difference becomes larger than a preset amount. Since the degradation can be small in magnitude, a "Winner Takes All" circuit is used to detect the difference between stressed and unstressed transistors. The "Winner Takes All" circuit (the name is derived from neural network applications) is used in the RadCell $V_T$ prognostic cell because it is very sensitive and it can be unbalanced so that the "Winner Takes All" circuit triggers when the difference in currents is a precise, pre-specified amount. Complete simulation results that demonstrate that the prognostic cell triggers at the correct amount of degradation have been conducted.

Hot Carrier Prognostic Cell

Hot carrier damage is predominant in NMOS devices because electrons are more easily accelerated in the channel than holes. Their mobility is higher, so the kinetic energy they achieve in the channel is higher. These "hot" electrons can cause impact ionization, resulting in an energetic electron-hole pair. Holes, which are the carriers responsible for most of the gate insulator damage, are more easily injected into the gate insulator under the bias conditions present in nMOS devices than they are in pMOS devices. The maximum hot carrier damage occurs when a lot of impact ionization occurs near the drain, resulting in a large number of redirected carriers, and when the drain to gate field is favorable for hole injection into the gate insulator. Worst-case bias conditions are achieved in minimum length devices (they have larger drain fields) when the drain voltage is large (again resulting in large drain fields) and when the gate voltage is around one third of the drain voltage (this gives the combination of large current and favorable hole injection bias).

A gate bias that is one third of the way between the power rails is a bias condition that is not usually present continuously. In digital circuits, the gate of devices is switched between the power rails. Therefore the transistors only sweep through worst-case conditions for hot carrier degradation. The faster they are swept through the critical bias conditions for hot carrier degradation, the less hot carrier damage that will occur. The worst-case bias condition is therefore a triangular wave gate voltage. For analog circuits, the worst case conditions are strongly dependent on the circuit topology and on input voltages. However, a triangular wave gate voltage is a good first order approximation even for analog circuit hot carrier degradation.

Hot carrier degradation is a cumulative effect in a MOSFET. The longer a device is held at the critical bias conditions where hot carrier damage occurs, the more damage that occurs. The amount of hot carrier damage that occurs in a circuit is therefore dependent on the circuit design. Hot carrier damage manifests itself as a change in threshold voltage and/or a degradation of the subthreshold swing. The sensitivity of a circuit to such changes in transistor characteristics also depends on the circuit topology. Designing a prognostic cell that accurately predicts circuit failure due to hot carrier degradation therefore requires reasonable estimates for the worst-case gate swing and for the amount of threshold voltage shift that the circuit can tolerate. Design engineers must always determine these quantities for their circuits, since process variations of these parameters also occur. Once these quantities are known, the correct prognostic cell can be selected that mirrors the worst case gate bias condition and trips the output at some fraction of the tolerable threshold voltage shift.

Figure 14:
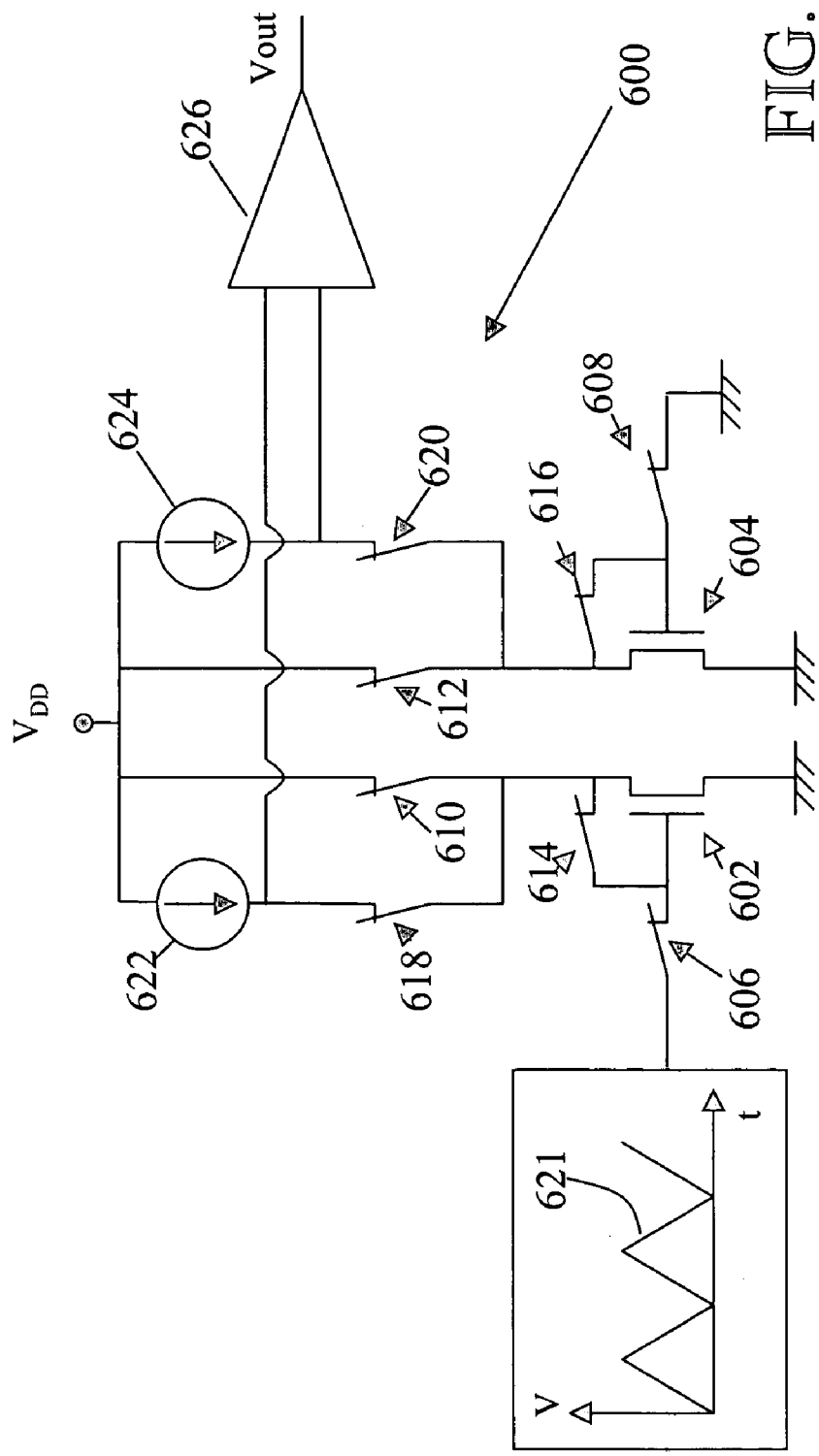
FIG. 14 is a schematic of a hot carrier prognostic cell.

As shown in FIG. 14, a hot carrier prognostic cell 600 works by applying a different gate voltage, and therefore a different hot carrier stress, to two matched MOS transistors 602 and 604. During the stress cycle, switches 606 and 608 are closed to hold the two monitor transistors 602 and 604 at different gate bias and switches 610 and 612 are closed to connect the drains to Vdd. Switches 614, 616, 618 and 620 are all open. The stressed test device 602 is suitably biased under worst case conditions, i.e. triangular wave 621. The reference device 604 is not stressed. This leads, over time, to measurable differences in drain current that can be measured. The relative amount of shift in the threshold voltage between the two devices is used in the hot carrier prognostic cell to determine whether the circuit will remain functional.

During the measurement cycle, the threshold voltage difference between the two monitor transistors is determined. Switches 606, 608, 610 and 612 are all opened. Switches 614 and 616 are closed to short the transistors' gates to their respective drains. Switches 618 and 620 are closed to supply current from constant current sources 622 and 624 to the respective drains and to connect a comparator 626 to measure the voltage difference at the drains. Comparator 626 triggers the output when the difference becomes larger than a preset amount.

Since the degradation can be small in magnitude a "Winner Takes All" circuit is used in the redesigned detection between stressed and unstressed transistors. The "Winner Takes All" circuit is very sensitive and can be unbalanced so that it triggers when the difference in currents is a precise, pre-specified amount.

Functionality of the circuit was tested using PSPICE simulation in a manner analogous to the simulation of the RadCell $V_T$ prognostic cell. The output was found to trigger at the correct preset level (5% threshold voltage shift for this example).

Metal Migration Prognostic Cell

Electromigration has been identified as the dominant on chip reliability problem at high temperatures. The most limiting aspect of a circuit's lifetime at high temperature is the interconnect conductor's ability to carry high currents for extended periods of time. At high temperatures the lifetime is severely shortened because momentum transfer between charge carriers and the metal lattice causes opens to be formed over time in the interconnect conductors. Decreasing the allowable current density increases circuit lifetime.

Figure 15:
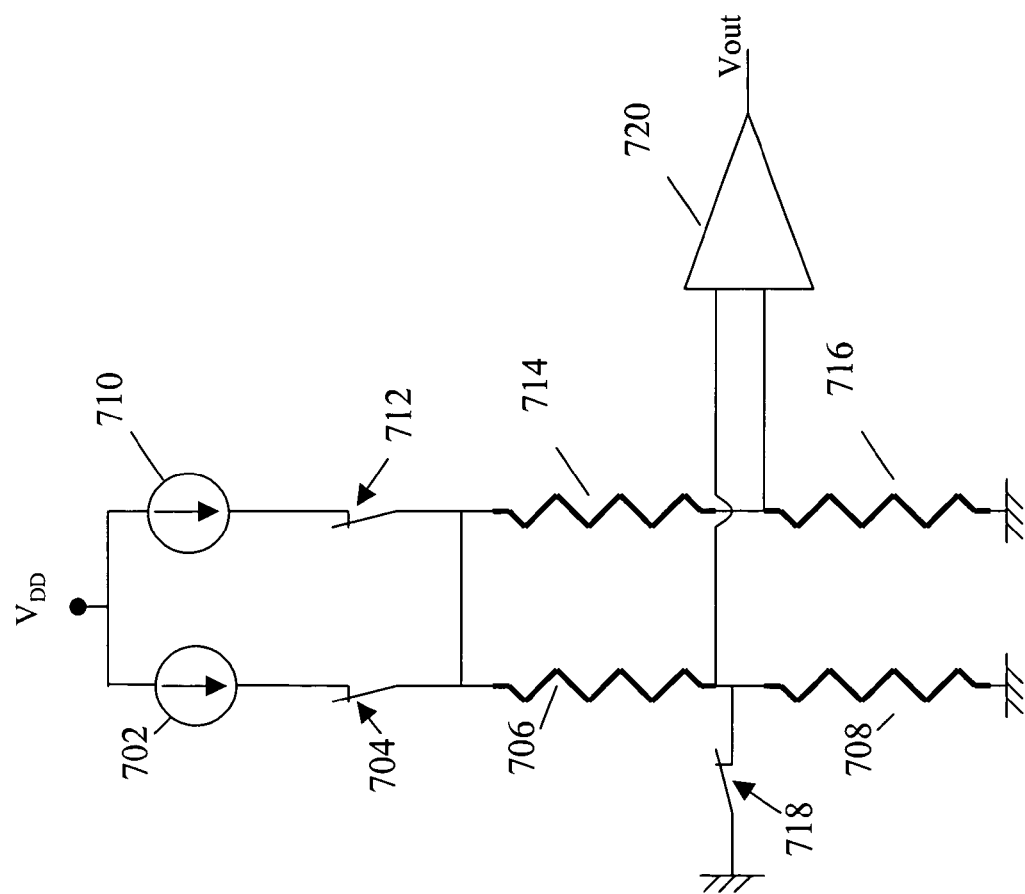
FIG. 15 is a schematic of a metal migration prognostic cell.

As shown in FIG. 15, a prognostic cell for electromigration can be made with two identical interconnect resistors, of which the first 706 is the stressed device and the second 708 is the reference. They are made of the same interconnect conductor material. During a stress cycle, a large current density is applied to the stressed device using a stress current source 702 while keeping switches 704 and 718 closed and switch 712 open to avoid stressing the reference. The main design challenge is to keep the power dissipation at a reasonable level relative to the chip power consumption. Since the degradation is much faster at high currents a current pulsing strategy applied with the stress current source keeps the power consumption down. The degradation increases the resistance of the stressed device as more of the conductor is displaced and voids start to open.

To measure the relative difference between the stressed and the reference resistors, a measurement current source 710 is applied periodically to the series connection of the stressed and reference resistors by closing switch 712 and opening 704 and 718. Two identical resistors that are never stressed 714 and 716 generate a reference voltage during the measurement cycle. The voltage between the stressed interconnect resistor 706 and the reference resistor 708 is compared to the reference voltage using a comparator 720. The comparator triggers the output when the difference becomes larger than a preset amount.

Latent Damage Detection

The prognostic cell can be used to identify any latent damage to a useful circuit and to predict its remaining useful life. This is done by increasing the operational stress on the cell off-line until the test component fails without stressing the useful circuit. The prognostic distance is then calculated based on the amount of time the stress must be applied for the test component to fail. The prognostic distance is a measure of the remaining useful life. Since this destroys the prognostic cell, the host IC may include multiple prognostic cells.

Multiple Readout

Figure 16:
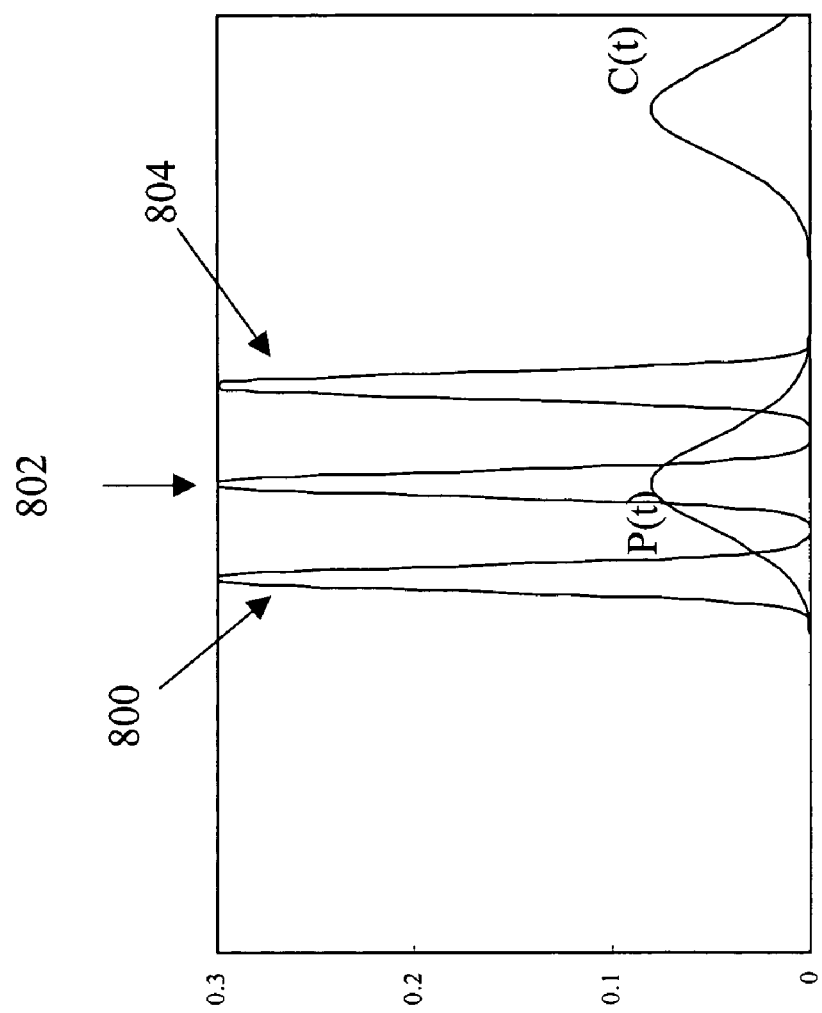
FIG. 16 is a plot of an oversampled prognostic cell with multiple readout capability.

As illustrated in FIG. 16, an oversampled prognostic cell with multiple readout capability will produce a failure indicator for each of the N test devices. For example, the failure of first device produces indicator 800, the N/2 device produces indicator 802 and the Nth device produces indicator 804 where N=16 in this example. The number of failed devices obviously increases with time and the number of failed devices at any particular time is indicative of the amount of useful life remaining. Multiple readout provides a more continuous monitoring of the amount of useful life remaining. Variations in the rate at which lifetime is being consumed indicate that a change in the environmental conditions in which the IC is operating is affecting its lifetime. This knowledge can be used to pinpoint causes of undue degradation or possibly to take corrective action. Increasing the number of devices serves both to improve the uncertainty in the failure prediction and to provide more readout opportunities.

An oversampled prognostic cell with multiple readout capability can be used as an off-line measurement for the entire reliability curve (bathtub curve) for a particular failure mechanism in integrated circuits. To accomplish this, a statistically significant number of test cells are placed in parallel in both the reference and stressed devices. Each test cell (or internally averaged set of test cells) is monitored independently by the comparison circuit. The bathtub curve of the host circuit is determined using a statistical model.

An oversampled prognostic cell with multiple readout capability can also be used to provide warranty analysis of ICs. In this case, the prognostic cell is used as a stress monitor rather than a predictor. For example, at periodic service dates the number of failed devices would be recorded and than analyzed to determine whether the IC was aging as expected or too quickly, etc.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. An integrated circuit (IC) chip, comprising:
   a useful circuit having a component that is subject to possible failure at a time t2 in response to operational stress; and
   a prognostic cell that is statistically designed to fail at a designed trigger time t1 under increased operational stress correlated to the operational stress on the useful circuit by a prognostic distance of t2–t1 ahead of the useful circuit, said cell failure triggering a failure indicator as a predictor of impending failure of the useful circuit.

2. The IC chip of claim 1, wherein the prognostic cell comprises:
   a test device having a test component;
   a coupling circuit that couples the operational stress applied to the useful circuit to the test device;
   a stress circuit that increases the operational stress applied to the test device to accelerate deterioration of the test component; and
   a comparison circuit that compares a performance characteristic of the stressed test component to a baseline performance characteristic, determines whether the stressed test component has failed and generates the failure indicator.

3. The IC chip of claim 2, wherein the useful circuit and the test device are equivalent devices.

4. The IC chip of claim 2, wherein the useful circuit and the test device are different devices with similar components.

5. The IC chip of claim 4, wherein the useful circuit's component is a gate insulator of a transistor and the test component is a spacer insulator layer of a capacitor.

6. The IC chip of claim 4, wherein the test component has different dimensions than the useful circuit's component to more accurately measure the deterioration of the test component.

7. The IC chip of claim 2, wherein the coupling circuit couples the test device to at least one of a supply voltage, a drive signal or a stress event outside normal operating condition applied to the useful circuit.

8. The IC chip of claim 7, wherein the stress circuit increases said supply voltage, alters said drive signal or prolongs the stress event to increase the operational stress applied to the test device.

9. The IC chip of claim 2, wherein the prognostic cell comprises a plurality of test devices, said comparison circuit triggering the failure indicator when a certain traction of the plurality fail.

10. The IC chip of claim 9, wherein said comparison circuit reads out each test device failure.

11. The IC chip of claim 2, further comprising a reference circuit that is subjected to reduced operation stress to establish the baseline for the performance characteristic.

12. The IC chip of claim 11, wherein the reference circuit is subjected to minimal operational stress.

13. The IC chip of claim 12, wherein the reference circuit is subjected to average operational stress.

14. The IC chip of claim 1, wherein the increased operational stress accelerates an end-of-life failure mechanism of the prognostic cell.

15. The IC chip of claim 1, wherein the increased operational stress is a function of the prognostic distance, the larger the prognostic distance the greater the increased operational stress.

16. The IC chip of claim 15, wherein the increased operational stress applied to the prognostic cell is the same operational stress that is applied to the useful circuit just increased so that the failure of the prognostic cell, although accelerated, tracks the failure of the useful circuit.

17. The IC chip of claim 15, wherein the operational stress comprises use stress and environmental stress.

18. The IC chip of claim 17, wherein the operational stress is increased by an elevated supply voltage, a different bias condition or a modified drive signal applied to the test device.

19. The IC chip of claim 1, wherein the useful circuit component comprises a gate insulator in a MOS device that is subject to failure due to an ESD event, said prognostic cell comprising a test capacitor having an insulator spacer layer, a coupling circuit that couples a supply voltage and the ESD event to the test capacitor, a stress circuit that increases the supply voltage to the test capacitor and prolongs the ESD event, and a comparison sub-circuit that compares the voltage supported across the test capacitor against a baseline voltage to detect degradation of the insulator spacer layer.

20. The IC chip of claim 19, wherein the coupling circuit comprises at least one diode that is forward biased by an ESD event to couple it to the test capacitor and the stress circuit comprises a charge pump that increases the supply voltage and sufficient capacitance to prolong the ESD event across the test capacitor.

21. The IC chip of claim 20, wherein the charge pump is periodically disconnected to allow the voltage across the test capacitor to degrade, said comparison circuit comparing this voltage against the baseline voltage to detect degradation of the insulator spacer layer.

22. The IC chip of claim 1, wherein the useful circuit comprises a MOS device in the IC that is subject to field oxide failure due to radiation effects, said prognostic cell predicts leakage under the field oxide failure comprising at least one of: a first inverter formed by a current source and a monitor transistor having a gate bias to stress the radiated monitor transistor, said current source being set to an allowed radiation degradation limit for end around leakage between the monitor transistor's source and drain; a second inverter formed by a current source and a monitor transistor having a gate bias to stress the radiated monitor transistor, said current source being set to an allowed radiation degradation limit for device to device leakage in a common well; a third inverter formed by a current source and a monitor transistor having a gate bias to stress the radiated monitor transistor, said current source being set to an allowed radiation degradation limit for device to a neighboring n-well leakage; and a comparator generating the failure indicator when any one of the inverters produces an output that inverts with respect to the baseline.

23. The IC chip of claim 1, wherein the useful circuit component is a MOS device that is subject to failure due to a threshold voltage shift based on radiation effects, said prognostic cell comprising test and reference MOS devices with different gate bias conditions so that the MOS devices exhibit different threshold voltage shifts when subjected to ionizing radiation, and a comparator circuit that generates the failure indicator when the difference in threshold voltages exceeds a preset amount.

24. The TC chip of claim 23, wherein a worst case gate bias is applied to the test MOS device and a best case gate bias is applied to the reference MOS device.

25. The IC chip of claim 1, wherein the useful circuit component comprises an insulator layer in the IC chip that is subject to failure based on an insulator electric field, said prognostic cell predicting time dependent dielectric breakdown (TDDB) of the insulator layer and comprising a test capacitor with an insulator spacer layer, a coupling circuit that couples a supply voltage from the host IC to the test capacitor, a stress circuit that increases the supply voltage applied to tile test capacitor to create a stressed insulator electric field, and a comparison circuit that compares the voltage supported across the test capacitor against a baseline voltage to detect degradation of the insulator spacer layer.

26. The IC chip of claim 25, wherein the stress circuit comprises a charge pump that pumps a well containing the test capacitor to create a larger voltage across the insulator spacer layer than the supply voltage.

27. The IC chip of claim 26, wherein the charge pump is periodically disconnected to allow the voltage across the test capacitor to degrade, said comparison circuit comparing this voltage against the baseline voltage to detect degradation of the insulator spacer layer.

28. The IC chip of claim 1, wherein the useful circuit comprises a MOS transistor in the IC, said prognostic cell predicting hot carrier degradation of the MOS transistor and comprising test and reference MOS devices with different gate voltages so that the test and reference MOS transistors exhibit, over time, different threshold voltage shifts, and a comparator circuit that generates the failure indicator when the difference in threshold voltages exceeds a preset amount.

29. The IC chip of claim 28, wherein the gate voltage of the test MOS device is approximately one third of the drain voltage for longer periods than the gate voltage of the reference MOS device.

30. The IC chip of claim 29, wherein the gate voltage of the test MOS device is a triangular wave.

31. The IC chip of claim 1, wherein the useful circuit component comprises interconnect conductors in the IC, said prognostic cell predicting metal migration of the interconnect conductors.

32. An integrated circuit (IC) chip, comprising:
a useful circuit having a component that is subject to failure in response to operational stress, said component having a cumulative failure probability C(t) where t2 equals the time at which the failure probability of the useful circuit's component has increased to a fraction f2, and;
a prognostic cell that is statistically designed to fail with a cumulative trigger probability P(t) where t1 equals the time at which a fraction f1 of the prognostic cells have triggered under increased operational stress correlated to the operational stress on the useful circuit by a prognostic distance equal to t2−t1 ahead of the useful circuit, said cell triggering a failure indicator as a predictor of impending failure of the useful circuit.

33. The IC chip of claim 32, wherein f1 is the tolerable fraction of non-accurate predictions by the prognostic cell and f2 is the tolerable failure traction of the useful circuit's component.

34. The IC chip of claim 33, wherein the prognostic cell is stressed so that P(t) reaches a value close to unity before C(t) start to increase appreciably.

35. The IC chip of claim 32, wherein the prognostic cell has a trigger probability density p(t) with a standard deviation that affects an amount of useful lifetime sacrificed by a premature trigger and/or a fraction of missed failure predictions of the useful circuit's component by late triggers.

36. The IC chip of claim 35, wherein the fraction f1 is set close to unity so that the fraction of missed failure predictions is small.

37. The IC chip of claim 35, wherein the trigger probability density p(t) overlaps with a failure probability density c(t) of the useful circuit's component, said fraction f1 being set so that the prognostic distance is positive and small.

38. The IC chip of claim 35, wherein the prognostic cell comprises a plurality of test devices with test components that fail the same performance characteristic, said cell triggering the failure indicator when a certain fraction of the plurality tail thereby reducing the standard deviation of p(t) and the amount of useful lifetime sacrificed.

39. The IC chip of claim 32, wherein the prognostic cell has a trigger probability density p(t) with a standard deviation that affects the accuracy of triggering the failure indicator, said prognostic cell comprising a plurality of test devices with test components that fail the same performance characteristic, said cell triggering the failure indicator when a certain fraction of the plurality fail thereby reducing the standard deviation of p(t) and improving the accuracy of the failure indicator.

40. The IC chip or claim 32, wherein the useful circuit component is a MOS device that is subject to failure due to a threshold voltage shift based on operational stress, said prognostic cell comprising test and reference MOS devices with different gate bias conditions so that the test MOS device is placed under increased operational stress and the MOS devices exhibit different threshold voltage shifts, and a comparator circuit that generates the failure indicator when the difference in threshold voltages exceeds a preset amount.

41. The IC chip of claim 40, wherein a worst case gate bias is applied to the test MOS device and a best case gate bias is applied to the reference MOS device.

42. The IC chip of claim 32, wherein the useful circuit is a MOS device and said prognostic cell predicts leakage under the field oxide failure of the MOS device, said prognostic cell comprising at least one of:
  a first inverter formed by a current source and a monitor transistor having a gate bias to stress the monitor transistor, said current source being set to an allowed degradation limit for end around leakage between the monitor transistor's source and drain;
  a second inverter formed by a current source and a monitor transistor having a gate bias to stress the monitor transistor, said current source being set to an allowed degradation limit for device to device leakage in a common well;
  a third inverter formed by a current source and a monitor transistor having a gate bias to stress the monitor transistor, said current source being set to an allowed degradation limit for device to a neighboring n-well leakage; and
  a comparator generating the failure indicator when any one of the inverters produces an output that inverts with respect to a baseline.

43. An integrated circuit (IC) chip, comprising:
  a useful circuit having a component that is subject to possible failure at a time t2 in response to operational stress; and
  a prognostic cell that is statistically designed to fail at a designed trigger time t1 under increased operational stress by a prognostic distance of t2−t1 ahead of the useful circuit component, said prognostic cell comprises:
    a plurality of test devices each having a test component;
    a coupling circuit that couples the operational stress applied to the useful circuit to the test devices;
    a stress circuit that increases the operational stress applied to the test devices as a function of the prognostic distance to accelerate deterioration of the test components; and
    a comparison circuit that compares a performance characteristic of each test component to a baseline, determines whether the stressed test component has failed and when a certain fraction of the plurality fail generates a failure indicator as a predictor of impending failure of the useful circuit.

44. The IC chip of claim 43, wherein the coupling circuit couples the test device to at least one of a supply voltage, a drive signal or a stress event outside normal operating condition applied to the useful circuit, and the stress circuit increases said supply voltage, alters said drive signal or prolongs the stress event to increase the operational stress applied to the test device.

45. The IC chip of claim 43, wherein said comparison circuit reads out each test device failure.

46. The IC chip of claim 43, further comprising a reference circuit that is subjected to reduced operational stress to establish the baseline for the performance characteristic.

47. The IC chip of claim 43, wherein the test component has a trigger probability density p(t) with a standard deviation that determines an amount of useful lifetime equal to the difference between the designed trigger time t1 and an average actual trigger time tavg sacrificed to achieve the prognostic distance, the number of test devices selected to narrow the standard deviation such that the amount of useful lifetime sacrificed is less than an acceptable amount.

48. An integrated circuit (IC) chip, comprising:
  a useful circuit having a component that is subject to possible failure at a time t2 in response to operational stress; and
  an oversampled prognostic cell with multiple readout capability that is statistically designed to fail at a designed trigger time t1 under increased operational stress by a prognostic distance of t2−t1 ahead of the useful circuit component, said prognostic cell comprises:
    a plurality of test devices each having a test component;
    a coupling circuit that couples the operational stress applied to the useful circuit to the test devices;
    a stress circuit that increases the operational stress applied to the test devices as a function of the prognostic distance to accelerate deterioration of the test components; and
    a comparison circuit that compares a performance characteristic of each test component to a baseline, determines whether the stressed test component has failed and generates a failure indicator for each failed test component.

49. The IC chip of claim 48, further comprising a reference circuit that is subjected to reduced operational stress to establish the baseline for the performance characteristic.

50. The IC chip of claim 48, wherein the test component has a trigger probability density p(t) with a standard deviation that determines an amount of useful lifetime equal to the difference between the designed trigger time t1 and an average actual trigger time tavg sacrificed to achieve the prognostic distance, the number of test devices selected to narrow the standard deviation such that the amount of useful lifetime sacrificed is less than an acceptable amount.

51. An integrated circuit (IC) chip, comprising:
  a useful MOS device that is subject to possible failure due to a threshold voltage shift at a time t2 in response to operational stress; and
  a prognostic cell that is statistically designed to fail at a designed trigger time t1 by a prognostic distance of t2−t1 ahead of the useful MOS device, said cell comprising test and reference MOS devices with different gate bias conditions that place the test MOS device under increased operational stress such that the MOS devices exhibit different threshold voltage shirts and a comparator circuit that generates a failure indicator when the difference in threshold voltages exceeds a preset amount as a predictor of impending failure of the useful MOS device.

52. The IC chip of claim 51, wherein the operational stress is based on an environmental stress and gate bias.

53. The IC Chip of claim 52, wherein all of the MOS devices are subjected to the same environmental stress, said test MOS device being subjected to a different gate bias condition that places it under increased operational stress.

54. The IC chip of claim 53, wherein the environmental stress is exposure to radiation.

55. The IC chip of claim 51, wherein said test and reference MOS device each have a source, a drain and a gate, said comparator connected to measure the voltage difference at the drains, further comprising:
  first and second switches to apply said different bias conditions to the gates of said test and reference MOS devices;

third and fourth switches to connect the drains of said test and reference MOS devices to a supply voltage;

fifth and sixth switches to connect the gates to the drains of said test and reference MOS devices; and seventh and eighth switches to connect the drains of said test and reference MOS devices to respective current sources, wherein during a stress cycle said first, second, third and fourth switches are closed and said fifth, sixth, seventh and eighth switches are open such that said test and reference MOS devices exhibit different threshold voltage shifts, and wherein during a measurement cycle, said first, second, third and fourth switches are open and said fifth, sixth, seventh and eighth switches are closed such that said current sources supply current to the respective drains to generate voltages at the drains.

* * * * *